United States Patent
Suzuki et al.

(10) Patent No.: US 12,426,512 B2
(45) Date of Patent: Sep. 23, 2025

(54) ACTUATOR DEVICE

(71) Applicant: HAMAMATSU PHOTONICS K.K., Hamamatsu (JP)

(72) Inventors: Daiki Suzuki, Hamamatsu (JP);
Takuma Osaki, Hamamatsu (JP);
Makoto Nozaki, Hamamatsu (JP);
Kota Sugizaki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 783 days.

(21) Appl. No.: 17/736,136

(22) Filed: May 4, 2022

(65) Prior Publication Data

US 2022/0367782 A1    Nov. 17, 2022

(30) Foreign Application Priority Data

May 12, 2021    (JP) ................................. 2021-080857

(51) Int. Cl.
*H10N 30/87*    (2023.01)
*G02B 26/08*    (2006.01)
(Continued)

(52) U.S. Cl.
CPC ....... *H10N 30/875* (2023.02); *G02B 26/0816* (2013.01); *H10N 30/20* (2023.02); *H10N 30/802* (2023.02)

(58) Field of Classification Search
CPC .... H10N 30/875; H10N 30/20; H10N 30/802; H10N 30/2023; B81B 3/0021;
(Continued)

(56) References Cited

U.S. PATENT DOCUMENTS 11,567,100 B2 *  1/2023  Reinke .................. B81B 3/0021
11,581,480 B2 *  2/2023  Akahane ................ H10D 86/60
(Continued)

FOREIGN PATENT DOCUMENTS

CN    115340059 A  * 11/2022  ......... G02B 26/0816
CN    115417369 A  * 12/2022  ......... G02B 26/0816
(Continued)

OTHER PUBLICATIONS

Office Action issued May 28, 2025 in related U.S. Appl. No. 17/736,146.
(Continued)

*Primary Examiner* — Pedro J Cuevas
(74) *Attorney, Agent, or Firm* — Faegre Drinker Biddle & Reath LLP

(57) ABSTRACT

A metal substrate supported by a wiring substrate includes a first extending portion and a first connection portion connected to the first extending portion. The first connection portion includes a first region facing a portion of a wiring substrate in a Z-axis direction, a second region being continuous from the first region, and a third region being continuous from the second region. When viewed in the Z-axis direction, in a direction perpendicular to a connection direction in which the third region is connected to the second region, a width of the second region is larger than a width of the third region. A first bonding member bonding the wiring substrate and the metal substrate includes a first portion disposed between the portion and the first region, and a second portion being continuous from the first portion. The second portion reaches the second region but does not reach the third region.

9 Claims, 12 Drawing Sheets

(51) Int. Cl.
*H10N 30/20* (2023.01)
*H10N 30/80* (2023.01)

(58) Field of Classification Search
CPC .......... B81B 7/02; H02N 2/001; H02N 2/005; H02N 2/0055; H02N 2/0075
See application file for complete search history.

(56) References Cited

U.S. PATENT DOCUMENTS

| | | | |
|---|---|---|---|
| 2010/0110527 A1 | 5/2010 | Liu et al. | |
| 2010/0327703 A1 | 12/2010 | Uetani et al. | |
| 2016/0049574 A1 | 2/2016 | Iwazaki et al. | |
| 2017/0199375 A1 | 7/2017 | Naono | |
| 2017/0217764 A1* | 8/2017 | Li | B81C 1/00333 |
| 2018/0040514 A1 | 2/2018 | Goh et al. | |
| 2018/0062065 A1 | 3/2018 | Arakawa et al. | |
| 2018/0151796 A1* | 5/2018 | Akahane | H05K 1/182 |
| 2018/0226563 A1 | 8/2018 | Kijima et al. | |
| 2020/0073113 A1 | 3/2020 | Nystrom | |
| 2020/0363631 A1 | 11/2020 | Luizzi et al. | |
| 2021/0140993 A1* | 5/2021 | Reinke | B81B 7/007 |
| 2021/0343925 A1 | 11/2021 | Saito et al. | |
| 2022/0365337 A1* | 11/2022 | Suzuki | H10N 30/204 |
| 2022/0367783 A1* | 11/2022 | Suzuki | H10N 30/875 |

FOREIGN PATENT DOCUMENTS

| | | | | |
|---|---|---|---|---|
| JP | H7-128361 | A | 5/1995 | |
| JP | H10-315485 | A | 12/1998 | |
| JP | 2010-103987 | A | 5/2010 | |
| JP | 2011-150038 | A | 8/2011 | |
| JP | 2011-179015 | A | 9/2011 | |
| JP | 2012-058367 | A | 3/2012 | |
| JP | 2012-078389 | A | 4/2012 | |
| JP | 2012-247523 | A | 12/2012 | |
| JP | 2013-114014 | A | 6/2013 | |
| JP | 2013-164278 | A | 8/2013 | |
| JP | 2014-160140 | A | 9/2014 | |
| JP | 2015-018047 | A | 1/2015 | |
| JP | 2016-081986 | A | 5/2016 | |
| JP | 2017-156522 | A | 9/2017 | |
| JP | 2019-045770 | A | 3/2019 | |
| JP | 2019-125777 | A | 7/2019 | |
| JP | 2019-132906 | A | 8/2019 | |
| JP | 2020-027893 | A | 2/2020 | |
| JP | 2020-187292 | A | 11/2020 | |
| JP | 2021087135 | A * | 6/2021 | |
| JP | 2022176027 | A * | 11/2022 | ......... G02B 26/0816 |
| JP | 2022176066 | A * | 11/2022 | ......... G02B 26/0816 |
| JP | 7367494 | B2 * | 10/2023 | |
| JP | 7672925 | B2 * | 5/2025 | |
| WO | 2015/064423 | A1 | 5/2015 | |
| WO | 2015/198513 | A1 | 12/2015 | |

OTHER PUBLICATIONS

Office Action issued May 28, 2025 in related U.S. Appl. No. 17/736,161.
Office Action issued May 30, 2025 in related U.S. Appl. No. 17/736,178.
Machine translation of Tanaka et al. JP 2020187292, Nov. 19, 2020.

* cited by examiner

ACTUATOR DEVICE

TECHNICAL FIELD

The present disclosure relates to an actuator device.

BACKGROUND

An actuator device has been known which includes a support body; a metal substrate supported by the support body; a bonding member that bonds the support body and the metal substrate; and a vibration element disposed on a main body portion included in the metal substrate. In such an actuator device, the metal substrate further includes a movable portion; a pair of extending portions extending from the main body portion such that the movable portion is located therebetween; a pair of coupling portions that couple the pair of extending portions and the movable portion; and a pair of connection portions connected to the pair of extending portions, and a facing region of each of the connection portions which faces a portion of the support body may be bonded to the portion of the support body by the bonding member (for example, refer to Japanese Unexamined Patent Publication No. 2020-187292).

In the actuator device described above, the bonding member reaches a connection region of each of the connection portion, the connection region being connected to the respective extending portion, thereby resulting in a shift of a driving characteristic of the actuator device from a design value, which is a concern. On the other hand, when the amount of the bonding member is reduced to prevent the bonding member from reaching the connection region of each of the connection portions, the bonding member does not sufficiently spread between the portion of the support body and the facing region of each of the connection portions, and bonding strength between the support body and the metal substrate decreases, which is a concern.

SUMMARY

An object of the present disclosure is to provide an actuator device in which a desired driving characteristic can be obtained and bonding strength between a support body and a metal substrate can be secured.

An actuator device according to one aspect of the present disclosure includes: a support body; a metal substrate supported by the support body; a bonding member bonding the support body and the metal substrate; and a vibration element disposed on a main body portion included in the metal substrate. The metal substrate further includes a movable portion, a first extending portion and a second extending portion extending from the main body portion such that the movable portion is located between the first extending portion and the second extending portion, a first coupling portion coupling the first extending portion and the movable portion, a second coupling portion coupling the second extending portion and the movable portion, and a connection portion connected to at least one of the first extending portion and the second extending portion. The connection portion includes a first region facing a portion of the support body in a thickness direction of the metal substrate, a second region being continuous from the first region, and a third region being continuous from the second region and connected to at least one of the first extending portion and the second extending portion. When viewed in the thickness direction of the metal substrate, a width of the second region in a direction perpendicular to a connection direction in which the third region is connected to the second region is larger than a width of the third region in the direction perpendicular to the connection direction. The bonding member includes a first portion disposed between the portion of the support body and the first region, and a second portion being continuous from the first portion. The second portion reaches the second region but does not reach the third region.

DETAILED DESCRIPTION

Figure 1:
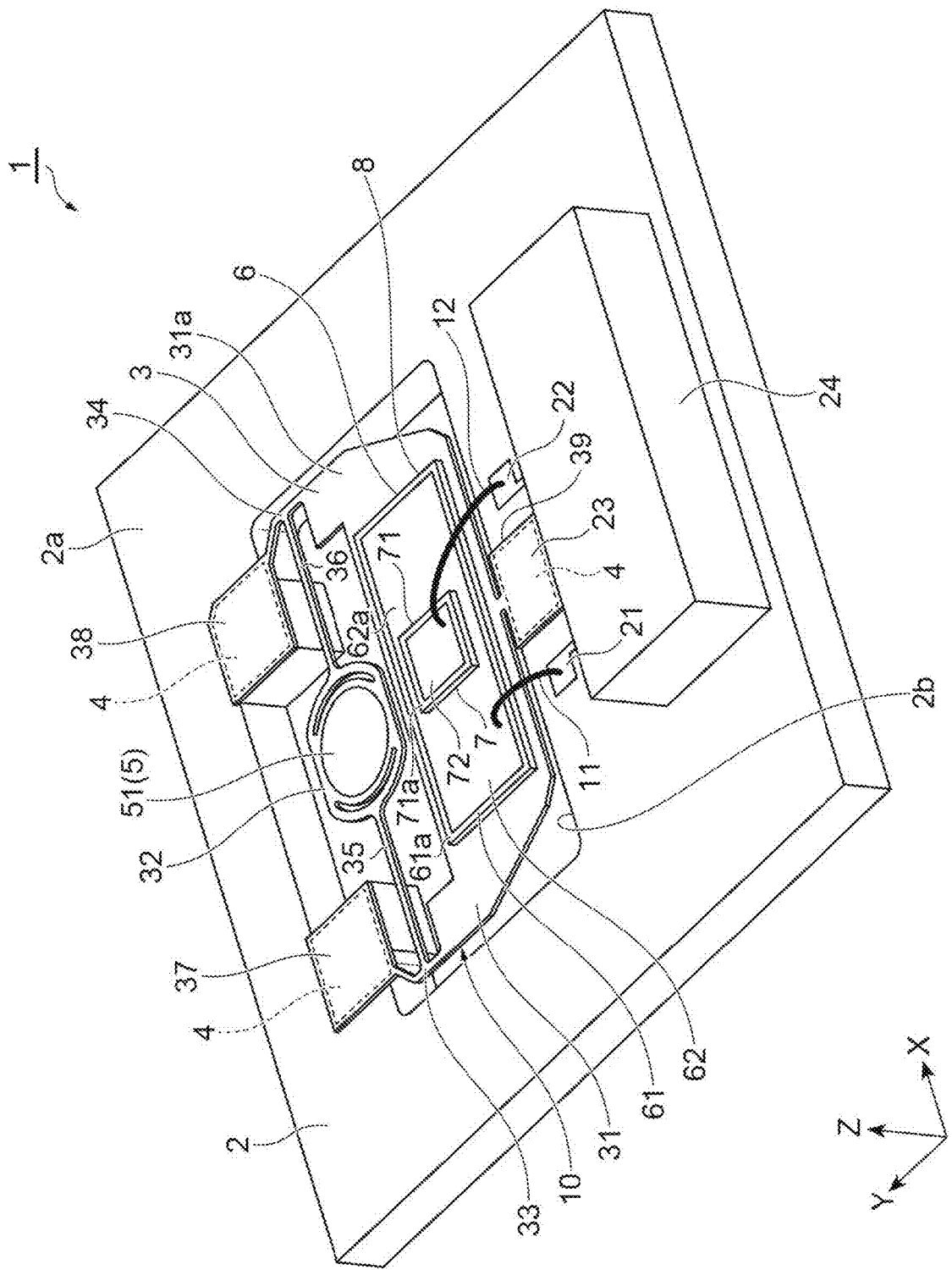
FIG. 1 is a perspective view of an actuator device of one embodiment.

Hereinafter, an embodiment of the present disclosure will be described in detail with reference to the drawings. Incidentally, in the drawings, the same or equivalent portions are denoted by the same reference signs, and duplicated descriptions will be omitted.

[Configuration of Actuator Device]

Figure 2:
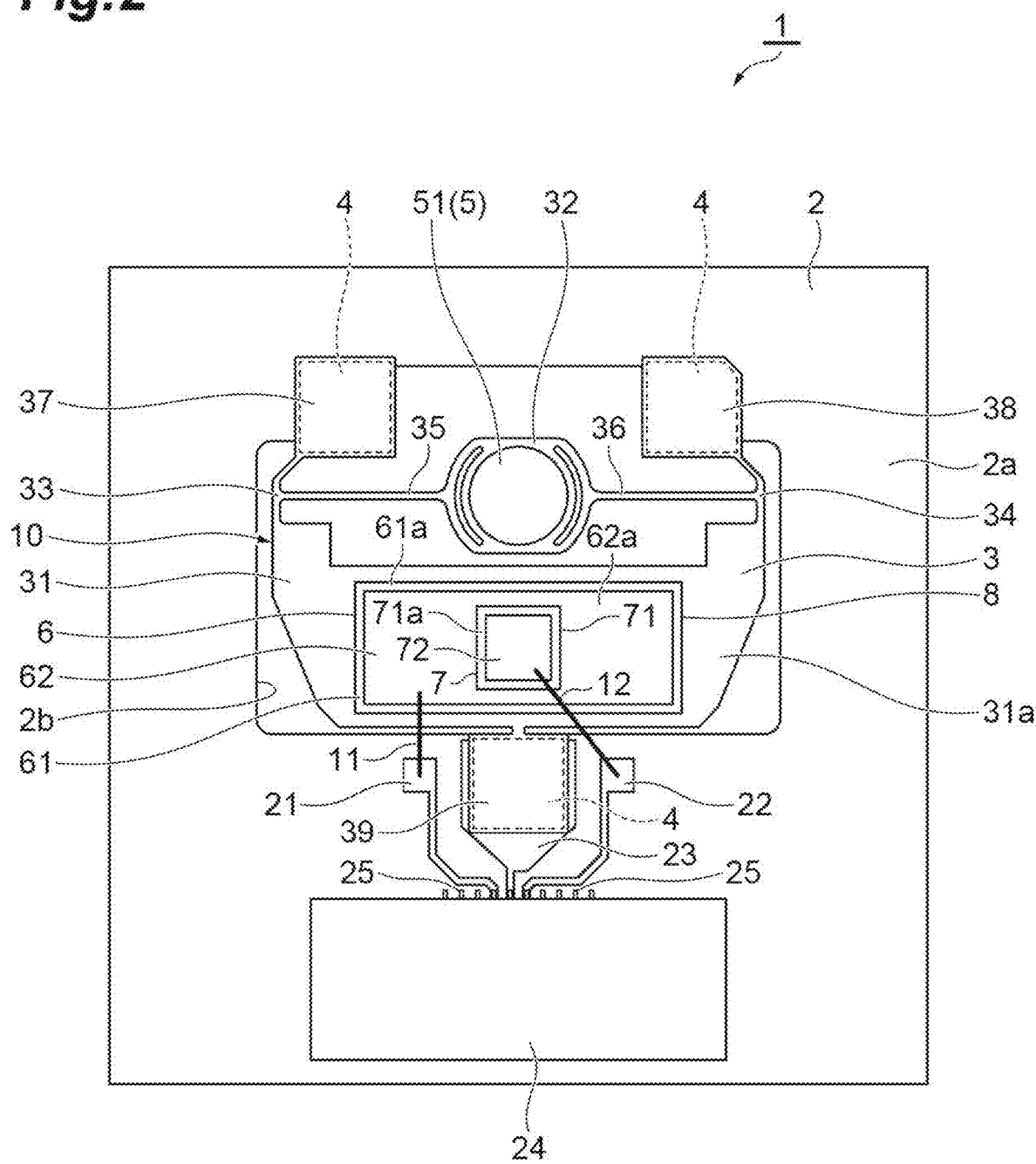
FIG. 2 is a plan view of the actuator device illustrated in FIG. 1.

As illustrated in FIGS. 1 and 2, an actuator device 1 includes a wiring substrate (support body) 2; a metal substrate 3; a first bonding member (bonding member) 4; an optical function unit 5 having an optical surface 51; a piezoelectric drive element (vibration element) 6; a piezoelectric detection element 7; and a second bonding member 8. The optical function unit 5 is provided on the metal substrate 3. The actuator device 1 is housed, for example, in a package (not illustrated). As one example, the package includes side walls, a bottom wall, and a top wall made of a material that transmits light, and has a box shape. For example, in the actuator device 1, when laser light is incident into the package via the top wall, the laser light is reflected by the optical surface 51 of the optical function unit 5 that is caused to periodically oscillate via the metal substrate 3 by the piezoelectric drive element 6, and is output to the outside via the top wall. An output direction of the laser light from the package changes periodically and continuously according to oscillation of the optical surface 51. Namely, in the present embodiment, the actuator device 1 is an optical scanning device.

The wiring substrate 2 has a placement surface 2a. An opening 2b that is open on the placement surface 2a and on a surface opposite the placement surface 2a is formed in the wiring substrate 2. The wiring substrate 2 has, for example, a rectangular frame shape. Examples of the material of the wiring substrate 2 include silicon, ceramic, quartz, glass, and plastic. The thickness of the wiring substrate 2 may be set to a thickness with which sufficient rigidity can be secured, and is, for example, 0.8 mm or more. In the present embodiment, the thickness of the wiring substrate 2 is 1.6 mm. In the following description, a thickness direction of the wiring substrate 2 is referred to as a Z-axis direction (thickness direction of the metal substrate), one direction perpendicular to the Z-axis direction is referred to as an X-axis direction, and a direction perpendicular to both the Z-axis direction and the X-axis direction is referred to as a Y-axis direction.

A plurality (in the present embodiment, three) of electrode pads 21, 22, and 23 are disposed on the placement surface 2a of the wiring substrate 2. The plurality of electrode pads 21, 22, and 23 are located on one side in the Y-axis direction with respect to the opening 2b of the wiring substrate 2, and are arranged along the X-axis direction. A connector 24 is attached to the placement surface 2a. The connector 24 is a port through which a voltage signal or the like is input to or output from each of the piezoelectric drive element 6 and the piezoelectric detection element 7. The connector 24 is located, for example, on one side in the Y-axis direction with respect to the plurality of electrode pads 21, 22, and 23. The connector 24 includes a plurality of terminals 25. The connector 24 is electrically connected to the plurality of electrode pads 21, 22, and 23 via the plurality of terminals 25, wirings of the wiring substrate 2 and the like.

The metal substrate 3 is supported by the wiring substrate 2. The metal substrate 3 is made of, for example, iron-based, stainless-based, copper-based, permalloy-based, titanium-based, tungsten-based, molybdenum-based metal, or the like, and has a plate shape. The thickness of the metal substrate 3 is, for example, 50 to 500 µm. The first bonding member 4 bonds the wiring substrate 2 and the metal substrate 3. The first bonding member 4 has conductivity. Examples of the material of the first bonding member 4 include an epoxy resin containing Ag particles.

The metal substrate 3 includes a main body portion 31; a movable portion 32; a first extending portion 33; a second extending portion 34; a first coupling portion 35; a second coupling portion 36; a first connection portion (connection portion) 37; a second connection portion (connection portion) 38; and a third connection portion (another connection portion) 39. The movable portion 32, the first extending portion 33, the second extending portion 34, the first coupling portion 35, the second coupling portion 36, the first connection portion 37, the second connection portion 38, and the third connection portion 39 are integrally formed.

The main body portion 31 is a portion to which the piezoelectric drive element 6 is fixed (disposed). The main body portion 31 is located inside the opening 2b of the wiring substrate 2 when viewed in the Z-axis direction. The movable portion 32 is a portion on which the optical function unit 5 is disposed. The movable portion 32 is located on the other side in the Y-axis direction with respect to the main body portion 31.

The first extending portion 33 and the second extending portion 34 extend from the main body portion 31 such that the movable portion 32 is located between the first extending portion 33 and the second extending portion 34. In the present embodiment, the movable portion 32 is located in the middle between the first extending portion 33 and the second extending portion 34. For example, the first extending portion 33 and the second extending portion 34 extend parallel to each other along the Y-axis direction. In the present embodiment, the first extending portion 33 has the same shape as that of the second extending portion 34.

The first coupling portion 35 extends along the X-axis direction between the first extending portion 33 and the movable portion 32. One end portion of the first coupling portion 35 is connected to the first extending portion 33, and the other end portion of the first coupling portion 35 is connected to the movable portion 32. Namely, the first coupling portion 35 couples the first extending portion 33 and the movable portion 32.

The second coupling portion 36 extends along the X-axis direction between the second extending portion 34 and the movable portion 32. One end portion of the second coupling portion 36 is connected to the second extending portion 34, and the other end portion of the second coupling portion 36 is connected to the movable portion 32. Namely, the second coupling portion 36 couples the second extending portion 34 and the movable portion 32.

In the present embodiment, the first coupling portion 35 and the second coupling portion 36 are located on a single straight line along the X-axis direction. From a positional relationship between the first extending portion 33 and the movable portion 32 and a positional relationship between the second extending portion 34 and the movable portion 32 described above, a length of the first coupling portion 35 in the X-axis direction is the same as a length of the second coupling portion 36 in the X-axis direction. In the present embodiment, the first coupling portion 35 has the same shape as that of the second coupling portion 36.

The movable portion 32, the first extending portion 33, the second extending portion 34, the first coupling portion 35, and the second coupling portion 36 are located inside the opening 2b of the wiring substrate 2 when viewed in the Z-axis direction. The first coupling portion 35 and the second coupling portion 36 function as torsion bars that elastically deform such that torsion bars twist according to deformation (displacement) of the first extending portion 33 and the second extending portion 34. The movable portion 32 oscillates around an axis along the X-axis direction according to elastic deformation of the first coupling portion 35 and the second coupling portion 36. Namely, the movable portion 32 is oscillatably supported by the first extending portion 33 and the second extending portion 34 via the first coupling portion 35 and via the second coupling portion 36.

The optical function unit 5 is disposed on a surface on an opposite side of the movable portion 32 from the opening 2b. The optical function unit 5 has, for example, a disk shape. The optical function unit 5 is attached to the movable portion 32 such that the optical surface 51 faces opposite the movable portion 32. The optical surface 51 is disposed in the middle between the first extending portion 33 and the second extending portion 34 in the X-axis direction. In the present embodiment, each of the metal substrate 3 and the optical surface 51 has a shape that is line symmetric with respect to a straight line passing through the center of the optical surface 51 along the Y-axis direction. As one example, the optical function unit 5 is made of glass or a semiconductor material such as silicon, and the optical surface 51 is formed of a reflective film formed on a surface on an opposite side of the optical function unit 5 from the movable portion 32. Namely, the optical surface 51 is a mirror surface (reflective surface). Incidentally, the reflective film of the optical function unit 5 can be omitted. In that case, the surface itself of the optical function unit 5 on the opposite side may be used as the optical surface 51.

The first connection portion 37 is connected to the first extending portion 33. The first connection portion 37 is located on the other side in the Y-axis direction with respect to the first extending portion 33. A portion on the other side of the first connection portion 37 in the Y-axis direction faces a portion of the wiring substrate 2. The first bonding member 4 is disposed between the portion on the other side of the first connection portion 37 and the portion of the wiring substrate 2. Incidentally, an electrode pad (not illustrated) electrically connected to the electrode pad 23 to have the same potential as that of the electrode pad 23 may be disposed on the portion of the wiring substrate 2.

The second connection portion 38 is connected to the second extending portion 34. The second connection portion 38 is located on the other side in the Y-axis direction with respect to the second extending portion 34. A portion on the other side of the second connection portion 38 in the Y-axis direction faces a portion of the wiring substrate 2. The first bonding member 4 is disposed between the portion on the other side of the second connection portion 38 and the portion of the wiring substrate 2. Incidentally, an electrode pad (not illustrated) electrically connected to the electrode pad 23 to have the same potential as that of the electrode pad 23 may be disposed on the portion of the wiring substrate 2. In the present embodiment, the first connection portion 37 and the second connection portion 38 are in a line symmetric relationship with respect to the straight line passing through the center of the optical surface 51 along the Y-axis direction.

The third connection portion 39 is connected to the main body portion 31. The third connection portion 39 is located on one side in the Y-axis direction with respect to the main body portion 31. A portion on one side of the third connection portion 39 in the Y-axis direction faces a portion of the wiring substrate 2 (portion on which the electrode pad 23 is disposed). The first bonding member 4 is disposed between the portion on the one side of the third connection portion 39 and the portion of the wiring substrate 2.

The piezoelectric drive element 6 is an element that generates plate waves in the metal substrate 3 to drive the actuator device 1. The piezoelectric drive element 6 is disposed on a placement surface 31a on an opposite side of the main body portion 31 from the opening 2b. The center of the piezoelectric drive element 6 in the X-axis direction is identical to the center of the movable portion 32 in the X-axis direction (namely, the center of the optical surface 51 in the X-axis direction). The piezoelectric drive element 6 includes a piezoelectric drive body 61, a first electrode 62, and a second electrode (not illustrated).

The piezoelectric drive body 61 includes a first main surface 61a and a second main surface (not illustrated). The first main surface 61a is a main surface on an opposite side of the piezoelectric drive body 61 from the placement surface 31a. The first electrode 62 is disposed on the first main surface 61a. The second main surface is a main surface on a placement surface 31a side of the piezoelectric drive body 61. The second electrode is disposed on the second main surface. Each of the first electrode 62 and the second electrode is, for example, a Ni/Au layer. In the Ni/Au layer, a Ni layer is disposed on the first main surface 61a, and a Au layer is disposed on the Ni layer. A thickness of the Ni layer is larger than a thickness of the Au layer. Each of the piezoelectric drive body 61, the first electrode 62, and the second electrode has, for example, a rectangular plate shape.

The piezoelectric drive body 61 is electrically connected to the first electrode 62 by being joined to the first electrode 62. The piezoelectric drive body 61 is electrically connected to the second electrode by being joined to the second electrode. The second bonding member 8 is disposed between the second electrode and the main body portion 31. The second bonding member 8 bonds the piezoelectric drive body 61 and the metal substrate 3. The second bonding member 8 has conductivity. Examples of the material of the second bonding member 8 include an epoxy resin containing Ag particles.

The piezoelectric detection element 7 is an element that detects an oscillation angle of the optical surface 51. The piezoelectric detection element 7 is disposed on a surface 62a. The surface 62a is a main surface on an opposite side of the first electrode 62 from the piezoelectric drive body 61. The center of the piezoelectric detection element 7 in the X-axis direction is identical to the center of the piezoelectric drive element 6 in the X-axis direction. The piezoelectric detection element 7 includes a piezoelectric detection body 71, a third electrode 72, and a fourth electrode (not illustrated). The piezoelectric detection body 71 includes a third main surface 71a and a fourth main surface (not illustrated). The third main surface 71a is a main surface on an opposite side of the piezoelectric detection body 71 from the first electrode 62. The third electrode 72 is disposed on the third main surface 71a. The fourth main surface is a main surface on a first electrode 62 side of the piezoelectric detection body 71. The fourth electrode is disposed on the fourth main surface. Each of the third electrode 72 and the fourth electrode is, for example, a Ni/Au layer. Each of the piezoelectric detection body 71, the third electrode 72, and the fourth electrode has, for example, a rectangular plate shape. The piezoelectric detection body 71 is electrically connected to the third electrode 72 by being joined to the third electrode 72. The piezoelectric detection body 71 is electrically connected to the fourth electrode by being joined to the fourth electrode. The second bonding member 8 is disposed between the fourth electrode and the first electrode 62. The second bonding member 8 bonds the piezoelectric detection body 71 and the piezoelectric drive body 61.

Here, an electrical connection relationship between the wiring substrate 2, the metal substrate 3, the piezoelectric drive element 6, and the piezoelectric detection element 7 will be described. As illustrated in FIG. 2, the first electrode 62 of the piezoelectric drive element 6 is electrically connected to the electrode pad 21 via a wire 11. The electrode pad 21 is electrically connected to a terminal 25 of the connector 24 via a wiring of the wiring substrate 2. Namely, the first electrode 62 of the piezoelectric drive element 6 is electrically connected to the connector 24 via the wire 11, the electrode pad 21, and the wiring of the wiring substrate 2.

The second electrode of the piezoelectric drive element 6 is electrically connected to the metal substrate 3 via the second bonding member 8 disposed between the second electrode and the main body portion 31. The third connection portion 39 of the metal substrate 3 is electrically connected to the electrode pad 23 via the first bonding member 4 disposed between the third connection portion 39 and the electrode pad 23. The electrode pad 23 is electrically connected to a terminal 25 of the connector 24 via a wiring of the wiring substrate 2. Namely, the second electrode of the piezoelectric drive element 6 is electrically connected to the connector 24 via the second bonding member 8, the metal substrate 3, the first bonding member 4, the electrode pad 23, and the wiring of the wiring substrate 2.

The third electrode 72 of the piezoelectric detection body 71 is electrically connected to the electrode pad 22 via a wire 12. The electrode pad 22 is electrically connected to a terminal 25 of the connector 24 via a wiring of the wiring substrate 2. Namely, the third electrode 72 of the piezoelectric detection body 71 is electrically connected to the connector 24 via the wire 12, the electrode pad 22, and the wiring of the wiring substrate 2.

The fourth electrode of the piezoelectric detection element 7 is electrically connected to the first electrode 62 of the piezoelectric drive element 6 via the second bonding member 8 disposed between the fourth electrode and the first electrode 62 of the piezoelectric drive element 6. Namely, the fourth electrode of the piezoelectric detection element 7 is electrically connected to the connector 24 via the second bonding member 8, the first electrode 62 of the piezoelectric drive element 6, the wire 11, the electrode pad 21, and the wiring of the wiring substrate 2.

The actuator device 1 is driven, for example, as follows according to the above-described electrical connection relationship. Specifically, in a state where the first electrode 62 of the piezoelectric drive element 6 and the fourth electrode of the piezoelectric detection element 7 are connected to a reference potential (for example, a ground potential) via the wire 11, the electrode pad 21, the wiring of the wiring substrate 2, and the connector 24, a drive voltage signal is input to the second electrode of the piezoelectric drive element 6 from the outside of the actuator device 1 via the connector 24, the wiring of the wiring substrate 2, the electrode pad 23, the first bonding member 4, and the metal substrate 3. Accordingly, the piezoelectric drive element 6 deforms and/or vibrates to generate periodic plate waves in the main body portion 31. Because of the generation of the periodic plate waves, torsional vibration (torsional resonance) is induced in the first coupling portion 35 and in the second coupling portion 36, and the movable portion 32 and the optical surface 51 oscillate. Namely, in the actuator device 1, while a torsional resonance system formed of the first coupling portion 35, the second coupling portion 36, the movable portion 32, and the optical surface 51 and the piezoelectric drive element 6 are disposed at separate positions, a Lamb wave resonance system is adopted, so that torsional resonance is generated with high driving efficiency. On the other hand, a voltage signal corresponding to a change in angle caused by the oscillation of the movable portion 32 and the optical surface 51 is output from the third electrode 72 of the piezoelectric detection body 71 to the outside of the actuator device 1 via the wire 12, the electrode pad 22, the wiring of the wiring substrate 2, and the connector 24, and an oscillation angle of the optical surface 51 is detected. Incidentally, the actuator device 1 includes a piezoelectric unit 10. The piezoelectric unit 10 includes the metal substrate 3, the piezoelectric drive element 6, the piezoelectric detection element 7, and the second bonding member 8 described above.

[Configuration of Wiring Substrate, Metal Substrate, and First Bonding Member]

Figure 3:
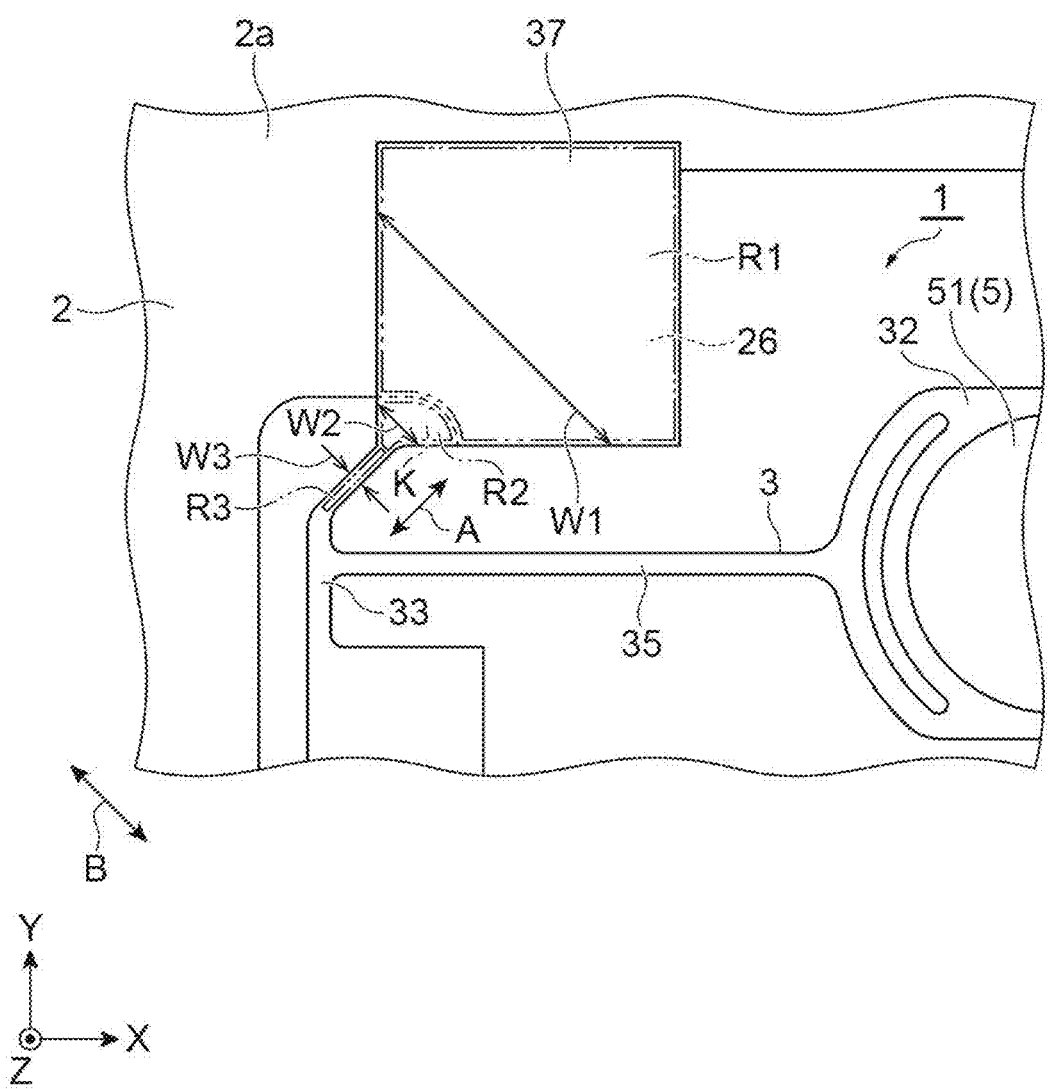
FIG. 3 is a plan view of a portion of a wiring substrate and a metal substrate illustrated in FIG. 1.

As illustrated in FIG. 3, the first connection portion 37 includes a first region R1, a second region R2, and a third region R3. The first region R1 is a region facing a portion 26 in the Z-axis direction. The portion 26 is a portion of the wiring substrate 2. The second region R2 is a region being continuous from the first region R1. The third region R3 is a region being continuous from the second region R2 and connected to the first extending portion 33. The "region connected to the first extending portion 33" includes both a region where the third region R3 is directly connected to the first extending portion 33 (namely, without passing through another portion) and a region where the third region R3 is indirectly connected to the first extending portion 33 (namely, via another portion). Namely, the third region R3 is not limited to an entire portion between the first extending portion 33 and the second region R2 in the first connection portion 37, and is a region being continuously connected to the second region R2. In the present embodiment, the second region R2 and the third region R3 do not face the wiring substrate 2 in the Z-axis direction.

In the following description, when viewed in the Z-axis direction, a direction in which the third region R3 is connected to the second region R2 is referred to as a connection direction A, and a direction perpendicular to the connection direction A is referred to as a direction B. In the present embodiment, the connection direction A intersects each of the X-axis direction and the Y-axis direction when viewed in the Z-axis direction. In the present embodiment, when viewed in the Z-axis direction, a region including the first region R1 and the second region R2 has a polygonal shape, and the second region R2 forms one corner K of the polygonal shape. As one example, when viewed in the Z-axis direction, the region including the first region R1 and the second region R2 has a substantially rectangular shape, and a boundary line between the first region R1 and the second region R2 is curved to protrude opposite a vertex of the corner K. When viewed in the Z-axis direction, the second region R2 has, for example, a fan shape. As one example, when viewed in the Z-axis direction, the third region R3 has an oblong shape having the connection direction A as a longitudinal direction, and is connected to a portion located farthest to one side in the X-axis direction and farthest to one side in the Y-axis direction in the second region R2.

When viewed in the Z-axis direction, a width W2 of the second region R2 in the direction B is larger than a width W3 of the third region R3 in the direction B. "When viewed in the Z-axis direction, the width W2 of the second region R2 in the direction B is larger than the width W3 of the third region R3 in the direction B" means that when viewed in the Z-axis direction, a minimum value of the width W2 of the second region R2 in the direction B is larger than a maximum value of the width W3 of the third region R3 in the direction B except for a boundary portion between the second region R2 and the third region R3.

Incidentally, with respect to the first region R1 facing the portion 26 of the wiring substrate 2 in the Z-axis direction, the second region R2 includes i) a region that does not face the wiring substrate 2 in the Z-axis direction, or ii) a region where a distance to the wiring substrate 2 in the Z-axis direction is larger than a distance between the first region R1 and the wiring substrate 2 in the Z-axis direction. In the present embodiment, the second region R2 is i) the region that does not face the wiring substrate 2 in the Z-axis direction.

In addition, a boundary between the second region R2 and the third region R3 includes i) a "line along the direction B" when the width of the first connection portion 37 in the direction B changes discontinuously beyond the "line along the direction B" as a boundary, ii) a "line along the direction B" when the rate of change in the width of the first connection portion 37 in the direction B changes discontinuously beyond the "line along the direction B" as a boundary, or iii) a "line along the direction B" when the width of the first connection portion 37 in the direction B is more than 1.1 times a minimum value of the width of the first connection portion 37 in the direction B beyond the "line along the direction B" as a boundary. In the present embodiment, the boundary between the second region R2 and the third region R3 is iii) the "line along the direction B" when the width of the first connection portion 37 in the direction B is more than 1.1 times the minimum value of the width of the first connection portion 37 in the direction B beyond the "line along the direction B" as a boundary. Incidentally, the third region R3 is a region including at least a portion of the first connection portion 37, the portion having a minimum width of the first connection portion 37 in the direction B, and a second portion 42 of the first bonding member 4 does not exceed at least a line where the width of the first connection portion 37 in the direction B is at its minimum.

When viewed in the Z-axis direction, a width W1 of the first region R1 in the direction B is larger than the width W2 of the second region R2 in the direction B. "When viewed in the Z-axis direction, the width W1 of the first region R1 in the direction B is larger than the width W2 of the second region R2 in the direction B" means that when viewed in the Z-axis direction, a maximum value of the width W1 of the first region R1 in the direction B is larger than a maximum value of the width W2 of the second region R2 in the direction B. In such a manner, when viewed in the Z-axis direction, the width of the first connection portion 37 in the direction B gradually increases from the third region R3 toward the first region R1.

In the present embodiment, when viewed in the Z-axis direction, an area of the first region R1 is larger than an area of the second region R2, and the area of the second region R2 is larger than an area of the third region R3. Further, when viewed in the Z-axis direction, the area of the first region R1 is larger than the sum of the area of the second region R2 and the area of the third region R3. The rigidity of the second region R2 is greater than the rigidity of the third region R3. The rigidity of the first region R1 is greater than the rigidity of the second region R2.

Figure 4:
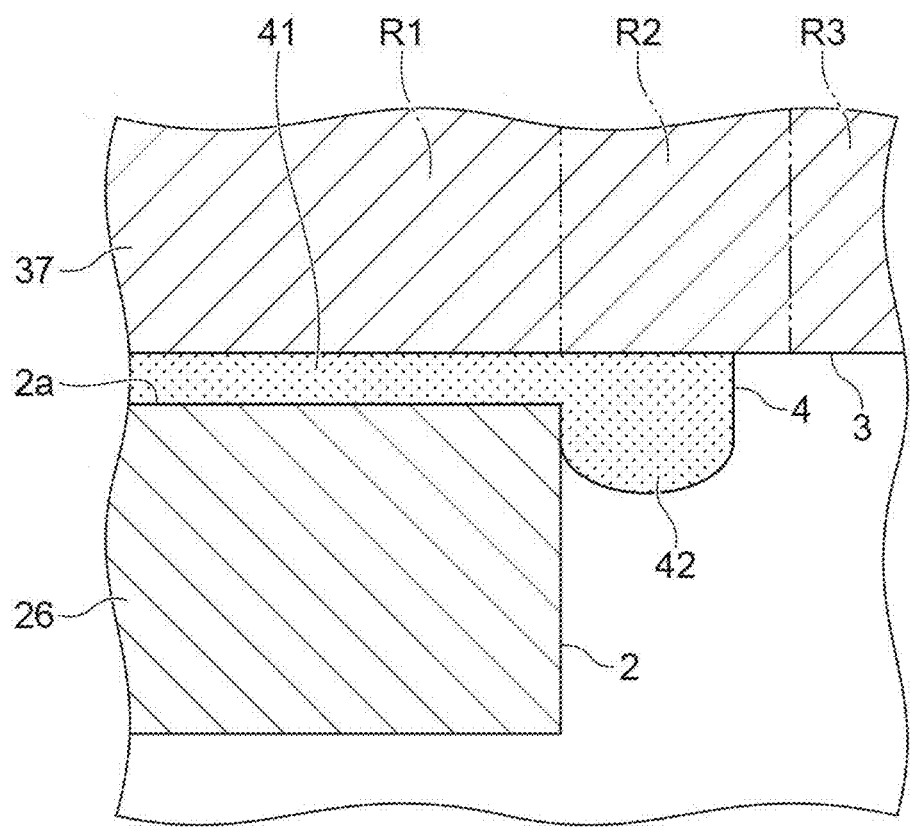
FIG. 4 is a cross-sectional view of a portion of the wiring substrate and the metal substrate illustrated in FIG. 3.

As illustrated in FIG. 4, the first bonding member 4 bonds the portion 26 of the wiring substrate 2 and the first connection portion 37. The first bonding member 4 includes a first portion 41 and the second portion 42. The first portion 41 is a portion of the first bonding member 4 which is disposed between the portion 26 and the first region R1. The second portion 42 is a portion of the first bonding member 4 which is continuous from the first portion 41 and which reaches the second region R2 but does not reach the third region R3. Namely, the second portion 42 is in contact with the second region R2 but is not in contact with the third region R3. As one example, the second portion 42 is in contact with the second region R2 and with a side surface of the portion 26, and a surface on an opposite side of the second portion 42 from the second region R2 is exposed to a space. Namely, the first bonding member 4 is in contact with each of the first region R1 and the second region R2 but is not in contact with the third region R3. In the first connection portion 37, the second region R2 is provided between the first region R1 and the third region R3 in such a manner, so that in the metal substrate 3, the first bonding member 4 protruding from the first region R1 stays in the second region R2, and the first bonding member 4 is not in contact with the third region R3 connected to the first extending portion 33.

Similarly to the first connection portion 37, the second connection portion 38 also includes the first region R1, the second region R2, and the third region R3. The first region R1 of the second connection portion 38 is a region facing a portion of the wiring substrate 2 in the Z-axis direction. The second region R2 of the second connection portion 38 is a region being continuous from the first region R1. The third region R3 of the second connection portion 38 is a region being continuous from the second region R2 and connected to the second extending portion 34. The first bonding member 4 bonds the portion of the wiring substrate 2 and the second connection portion 38. Similarly to the first bonding member 4 that bonds the portion 26 and the first connection portion 37, the first bonding member 4 that bonds the portion of the wiring substrate 2 and the second connection portion 38 also includes the first portion 41 and the second portion 42. The configuration of the second connection portion 38 and the first bonding member 4 is the same as the configuration of the first connection portion 37 and the first bonding member 4 (are in a line symmetric relationship with respect to the straight line passing through the center of the optical surface 51 along the Y-axis direction).

Figure 5:
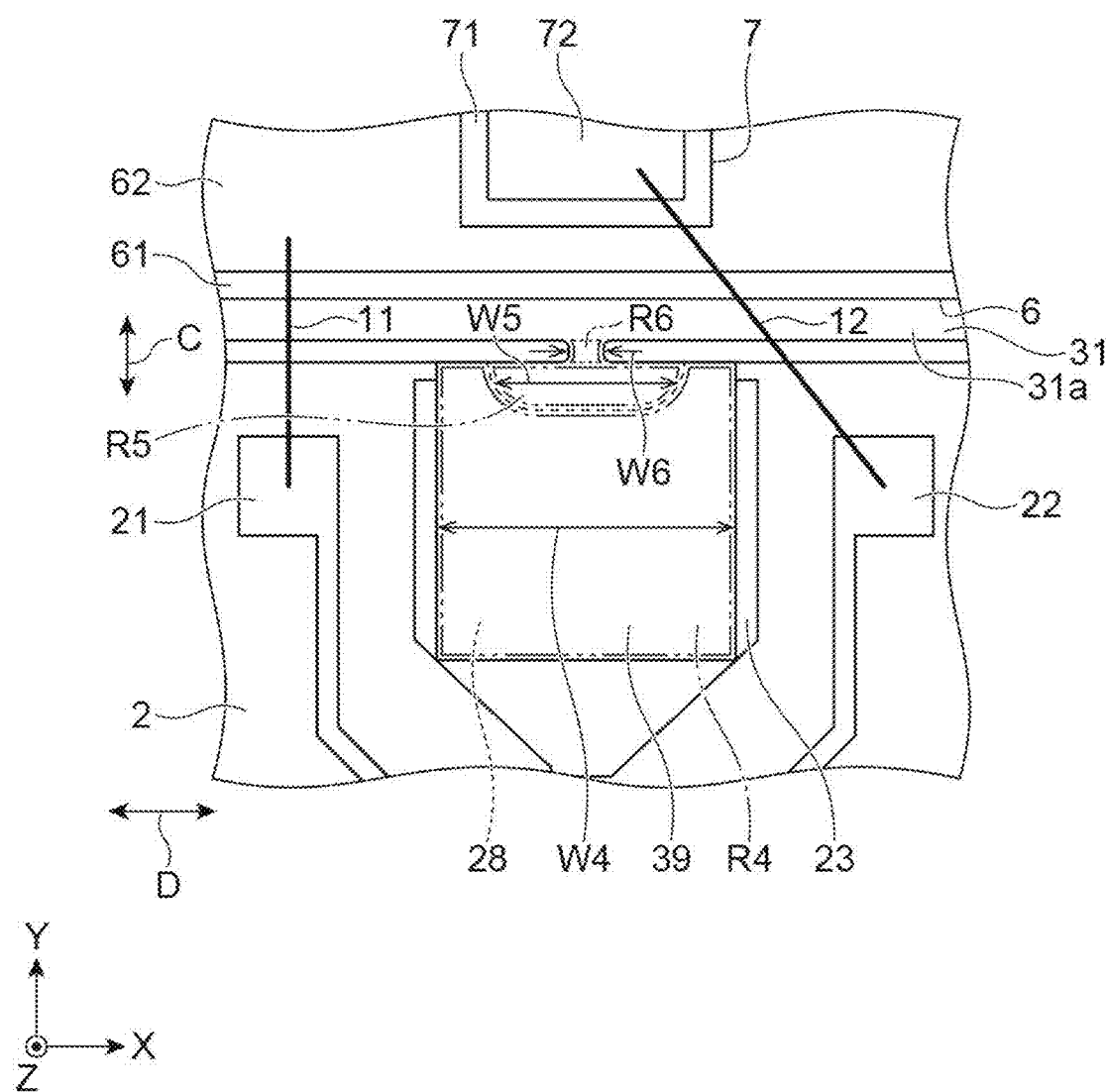
FIG. 5 is a plan view of a portion of the wiring substrate and the metal substrate illustrated in FIG. 1.

As illustrated in FIG. 5, the third connection portion 39 includes a fourth region R4, a fifth region R5, and a sixth region R6. The fourth region R4 is a region facing a portion 28 in the Z-axis direction. The portion 28 is another portion of the wiring substrate 2 being different from the portion 26. The fifth region R5 is a region being continuous from the fourth region R4. The sixth region R6 is a region being continuous from the fifth region R5 and connected to the main body portion 31. The "region connected to the main body portion 31" includes both a region where the sixth region R6 is directly connected to the main body portion 31 (namely, without passing through another portion) and a region where the sixth region R6 is indirectly connected to the main body portion 31 (namely, via another portion). Namely, the sixth region R6 is not limited to an entire portion between the main body portion 31 and the fifth region R5 in the third connection portion 39, and is a region being continuously connected to the fifth region R5.

In the following description, when viewed in the Z-axis direction, a direction in which the sixth region R6 is connected to the fifth region R5 (another connection direction) is referred to as a connection direction C, and a direction perpendicular to the connection direction C is referred to as a direction D. In the present embodiment, when viewed in the Z-axis direction, a region including the fourth region R4 and the fifth region R5 has a polygonal shape, and the fifth region R5 forms a part of one side portion of the polygonal shape. As one example, when viewed in the Z-axis direction, the region including the fourth region R4 and the fifth region R5 has a rectangular shape, and a boundary line between the fourth region R4 and the fifth region R5 is curved to protrude opposite the above side portion. When viewed in the Z-axis direction, the fifth region R5 has, for example, a semi-elliptical shape. When viewed in the Z-axis direction, the sixth region R6 has, for example, a substantially rectangular shape and is connected to a portion located at the center in the X-axis direction and farthest to the other side in the Y-axis direction in the fifth region R5.

When viewed in the Z-axis direction, a width W5 of the fifth region R5 in the direction D is larger than a width W6 of the sixth region R6 in the direction D. "When viewed in the Z-axis direction, the width W5 of the fifth region R5 in the direction D is larger than the width W6 of the sixth region R6 in the direction D" means that when viewed in the Z-axis direction, a minimum value of the width W5 of the fifth region R5 in the direction D is larger than a maximum value of the width W6 of the sixth region R6 in the direction D except for a boundary portion between the fifth region R5 and the sixth region R6.

Incidentally, with respect to the fourth region R4 facing the portion 28 of the wiring substrate 2 in the Z-axis direction, the fifth region R5 includes i) a region that does not face the wiring substrate 2 in the Z-axis direction, or ii) a region where a distance to the wiring substrate 2 in the Z-axis direction is larger than a distance between the fourth region R4 and the wiring substrate 2 in the Z-axis direction. In the present embodiment, the fifth region R5 is i) the region that does not face the wiring substrate 2 in the Z-axis direction.

In addition, a boundary between the fifth region R5 and the sixth region R6 includes i) a "line along the direction D" when the width of the third connection portion 39 in the direction D changes discontinuously beyond "line along the direction D" as a boundary, ii) a "line along the direction D" when the rate of change in the width of the third connection portion 39 in the direction D changes discontinuously beyond the "line along the direction D" as a boundary, or iii) a "line along the direction D" when the width of the third connection portion 39 in the direction D is more than 1.1 times a minimum value of the width of the third connection portion 39 in the direction D beyond the "line along the direction D" as a boundary. In the present embodiment, the boundary between the fifth region R5 and the sixth region R6 is iii) the "line along the direction D" when the width of the third connection portion 39 in the direction D is more than 1.1 times the minimum value of the width of the third connection portion 39 in the direction D beyond the "line along the direction D" as a boundary. Incidentally, the sixth region R6 is a region including at least a portion of the third connection portion 39, the portion having a minimum width of the third connection portion 39 in the direction D, and a fourth portion 44 of the first bonding member 4 does not exceed at least a line where the width of the third connection portion 39 in the direction D is at its minimum.

When viewed in the Z-axis direction, a width W4 of a portion of the fourth region R4 in the direction D is larger than the width W5 of the fifth region R5 in the direction D, the portion being located on one side of the fifth region R5 in the Y-axis direction. "When viewed in the Z-axis direction, the width W4 of a portion of the fourth region R4 in the direction D is larger than the width W5 of the fifth region R5 in the direction D, the portion being located on one side of the fifth region R5 in the Y-axis direction" means that when viewed in the Z-axis direction, a maximum value of the width W4 in the direction D is larger than a maximum value of the width W5 of the fifth region R5 in the direction D. In such a manner, when viewed in the Z-axis direction, the width of the third connection portion 39 in the direction D gradually increases from the sixth region R6 toward the fourth region R4.

In the present embodiment, when viewed in the Z-axis direction, an area of the fourth region R4 is larger than an area of the fifth region R5. Further, when viewed in the Z-axis direction, the area of the fourth region R4 is larger than the sum of the area of the fifth region R5 and an area of the sixth region R6. The rigidity of the fifth region R5 is greater than the rigidity of the sixth region R6. The rigidity of the fourth region R4 is greater than the rigidity of the fifth region R5.

Figure 6:
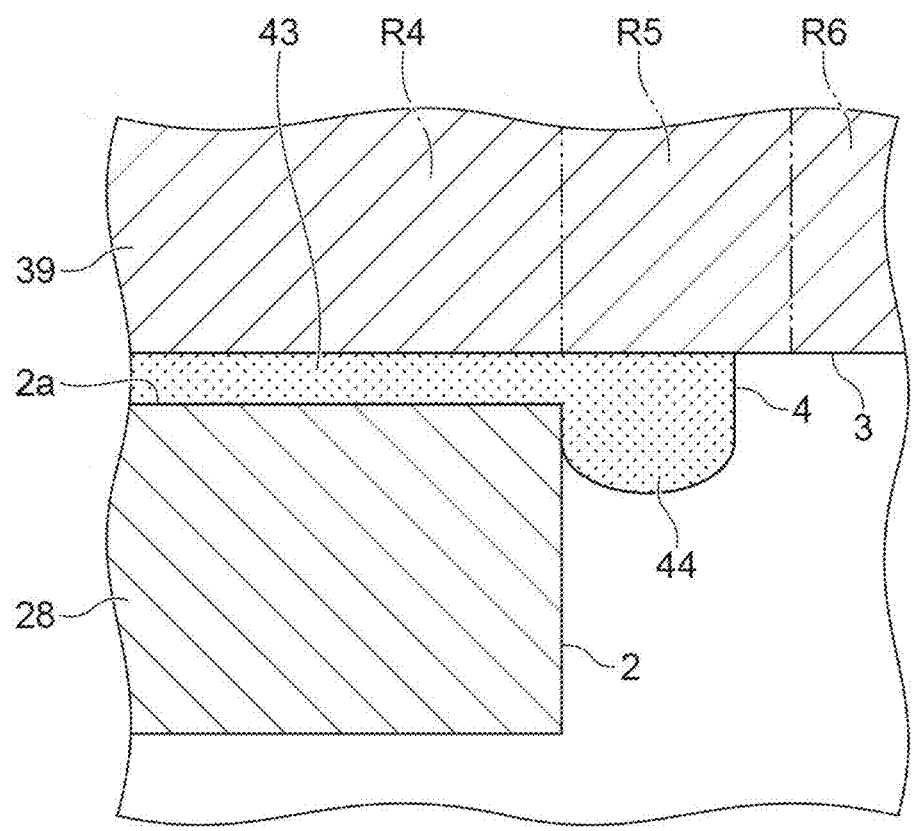
FIG. 6 is a cross-sectional view of a portion of the wiring substrate and the metal substrate illustrated in FIG. 5.

As illustrated in FIG. 6, in the present embodiment, the fifth region R5 and the sixth region R6 do not face the wiring substrate 2 in the Z-axis direction. The first bonding member 4 bonds a portion 28 (another portion) of the wiring substrate 2 and the third connection portion 39. The first bonding member 4 includes a third portion 43 and the fourth portion 44. The third portion 43 is a portion of the first bonding member 4 which is disposed between the portion 28 and the fourth region R4. The fourth portion 44 is a portion of the first bonding member 4 which is continuous from the third portion 43 and which reaches the fifth region R5 but does not reach the sixth region R6. Namely, the fourth portion 44 is in contact with the fifth region R5 but is not in contact with the sixth region R6. As one example, the fourth portion 44 is in contact with the fifth region R5 and with a side surface of the portion 28, and a surface on an opposite side of the fourth portion 44 from the fifth region R5 is exposed to a space. Namely, the first bonding member 4 is in contact with each of the fourth region R4 and the fifth region R5 but is not in contact with the sixth region R6. In the third connection portion 39, the fifth region R5 is provided between the fourth region R4 and the sixth region R6 in such a manner, so that in the metal substrate 3, the first bonding member 4 protruding from the fourth region R4 stays in the fifth region R5, and the first bonding member 4 is not in contact with the sixth region R6 connected to the main body portion 31.

[Actions and Effects]

In the actuator device 1, in the first connection portion 37, the first portion 41 of the first bonding member 4 is disposed between the portion 26 of the wiring substrate 2 and the first region R1, and the second portion 42 of the first bonding member 4 which is continuous from the first portion 41 reaches the second region R2 being continuous from the first region R1. Accordingly, it is possible to cause the first bonding member 4 to sufficiently spread between the portion 26 of the wiring substrate 2 and the first region R1, and it is possible to secure bonding strength between the wiring substrate 2 and the metal substrate 3. Also, in the second connection portion 38, similarly, it is possible to cause the first bonding member 4 to sufficiently spread between a portion of the wiring substrate 2 and the first region R1, and it is possible to secure bonding strength between the wiring substrate 2 and the metal substrate 3. On the other hand, in the first connection portion 37, the second portion 42 of the first bonding member 4 reaches the second region R2 having the width W2 larger than the width W3 of the third region R3, but the second portion 42 of the first bonding member 4 does not reach the third region R3 having the width W3 smaller than the width W2 of the second region R2. Accordingly, it is possible to suppress a deterioration in the vibration characteristic of the first connection portion 37, and it is possible to obtain a desired driving characteristic. Also, in the second connection portion 38, similarly, it is possible to suppress a deterioration in the vibration characteristic of the second connection portion 38, and it is possible to obtain a desired driving characteristic. Therefore, according to the actuator device 1, it is possible to obtain a desired driving characteristic, and it is possible to secure bonding strength between the wiring substrate 2 and the metal substrate 3.

For example, in a configuration of an actuator device of the related art in which each connection portion includes a facing region facing a portion of a wiring substrate, and a vibration region being continuous with the facing region and connected to an extending portion, there are the following problems. Namely, in the actuator device of the related art, a bonding member reaches the vibration region where a resonant mode of a metal substrate is likely to be affected (namely, the metal substrate has relatively low rigidity and is likely to vibrate), and the resonant frequency in the resonant mode of the metal substrate greatly changes from a design value depending on the amount and the place of protrusion of the bonding member onto the vibration region, which is a problem. For example, even when the resonant frequency in a resonant mode of a main body portion changes depending on the amount and the place of protrusion of the bonding member onto the vibration region, the resonant frequency in a resonant mode of a movable portion does not change. However, a drive voltage to obtain a desired swing angle in an optical surface is affected by a ratio between the resonant frequency in the resonant mode of the main body portion and the resonant frequency in the resonant mode of the movable portion. For this reason, the bonding member reaches the vibration region having relatively low rigidity, so that a desired driving characteristic cannot be obtained, which is a concern. In contrast, according to the actuator device 1, since the width W2 of the second region R2 is larger than the width W3 of the third region R3 in each of the first connection portion 37 and the second connection portion 38, the rigidity of the third region R3 decreases relative to that of the second region R2, and the third region R3 can be selectively vibrated. For this reason, it is possible to stably obtain the driving characteristic of the actuator device 1 regardless of the amount and the place of protrusion of the first bonding member 4 onto the second region R2.

In each of the first connection portion 37 and the second connection portion 38, when viewed in the Z-axis direction, the area of the first region R1 is larger than the area of the second region R2. Accordingly, it is possible to reliably secure bonding strength between the wiring substrate 2 and the metal substrate 3.

In each of the first connection portion 37 and the second connection portion 38, when viewed in the Z-axis direction, the area of the first region R1 is larger than the sum of the area of the second region R2 and the area of the third region R3. Accordingly, it is possible to more reliably secure bonding strength between the wiring substrate 2 and the metal substrate 3.

In each of the first connection portion 37 and the second connection portion 38, when viewed in the Z-axis direction, the width W1 of the first region R1 in the direction B perpendicular to the connection direction A is larger than the width W2 of the second region R2 in the direction B. Accordingly, the width of the first connection portion 37 gradually increases from the third region R3 toward the first region R1, so that it is possible to secure both bonding strength between the wiring substrate 2 and the metal substrate 3 and a desired driving characteristic.

In each of the first connection portion 37 and the second connection portion 38, when viewed in the Z-axis direction, the region including the first region R1 and the second region R2 has a polygonal shape, and when viewed in the Z-axis direction, the second region R2 forms the one corner K of the polygonal shape. Accordingly, it is possible to simply provide the second region R2 when compared to, for example, a case where the second region R2 forms a part of a side portion of the region including the first region R1 and the second region R2.

In each of the first connection portion 37 and the second connection portion 38, when viewed in the Z-axis direction, the boundary line between the first region R1 and the second region R2 is curved to protrude opposite the vertex of the corner K. Accordingly, since the distance from the vertex of the corner K of the second region R2 to the boundary between the first region R1 and the second region R2 can be made uniform, it is possible to reliably prevent the first bonding member 4 from reaching the third region R3.

In each of the first connection portion 37 and the second connection portion 38, the first connection portion 37 is connected to the first extending portion 33, and the second connection portion 38 is connected to the second extending portion 34. Accordingly, it is possible to stably obtain a desired driving characteristic when compared to a case where one connection portion is connected to both the first extending portion 33 and the second extending portion 34.

In each of the first connection portion 37 and the second connection portion 38, the second region R2 and the third region R3 do not face the wiring substrate 2 in the Z-axis direction. Accordingly, it is possible to reliably avoid a risk that the first bonding member 4 spreads between the wiring substrate 2 and the second region R2 to reach the third region R3.

The third connection portion 39 is connected to the main body portion 31, and includes the fourth region R4 facing the portion 28 of the wiring substrate 2 in the Z-axis direction, the fifth region R5 being continuous from the fourth region R4, and the sixth region R6 being continuous from the fifth region R5 and connected to the main body portion 31. When viewed in the Z-axis direction, the width W5 of the fifth region R5 in the direction D perpendicular to the connection direction C is larger than the width W6 of the sixth region R6 in the direction D, and the first bonding member 4 further includes the third portion 43 disposed between the portion 28 and the fourth region R4, and the fourth portion 44 being continuous from the third portion 43. The fourth portion 44 reaches the fifth region R5 but does not reach the sixth region R6. Accordingly, also, in the third connection portion 39, since it is possible to cause the first bonding member 4 to sufficiently spread between the portion 28 and the fourth region R4 of the third connection portion 39, and it is possible to suppress a deterioration in the vibration characteristic of the third connection portion 39, it is possible to reliably obtain a desired driving characteristic, and it is possible to reliably secure bonding strength between the wiring substrate 2 and the metal substrate 3.

Modification Examples

The present disclosure is not limited to the above embodiment. For example, in each of the first connection portion 37 and the second connection portion 38, the configuration of the first region R1, the second region R2, and the third region R3 is not limited to that of the above embodiment. For example, when viewed in the Z-axis direction, the area of the first region R1 may be equal to the area of the second region R2 or smaller than the area, and the area of the second region R2 may be equal to the area of the third region R3 or smaller than the area. Further, when viewed in the Z-axis direction, the area of the first region R1 may be equal to the sum of the area of second region R2 and the area of the third region R3 or smaller than the sum of the areas.

Figure 7:
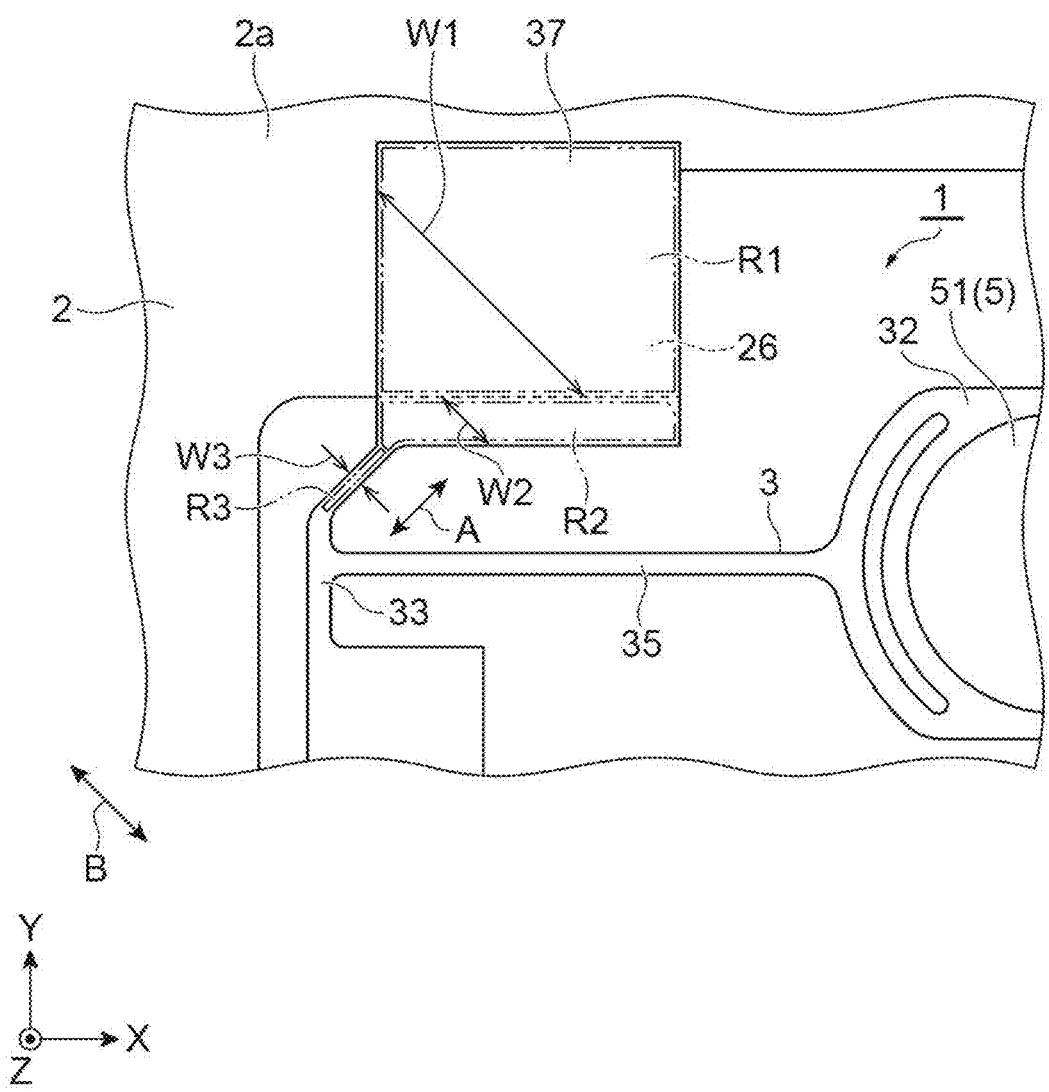
FIG. 7 is a plan view of a portion of a wiring substrate and a metal substrate of a first modification example.

In addition, for example, in each of the first connection portion 37 and the second connection portion 38, the first region R1, the second region R2, and the third region R3 may have shapes being different from those of the above embodiment. For example, the third region R3 may be curved. In that case, the connection direction A is a tangential direction at a position closest to a second region R2 side when viewed in the Z-axis direction, among tangential directions at positions on an axis of the third region R3. In addition, the example illustrated in FIG. 7 is different from the above embodiment in that the second region R2 of the first connection portion 37 has a rectangular shape when viewed in the Z-axis direction. When viewed in the Z-axis direction, the second region R2 has a substantially oblong shape having the X-axis direction as a longitudinal direction. In the example illustrated in FIG. 7, the second region R2 is i) a region that does not face the wiring substrate 2 in the Z-axis direction. In the example illustrated in FIG. 7, a boundary between the second region R2 and the third region R3 is iii) a "line along the direction B" when the width of the first connection portion 37 in the direction B is more than 1.1 times the minimum value of the width of the first connection portion 37 in the direction B beyond the "line along the direction B" as a boundary.

Figure 8:
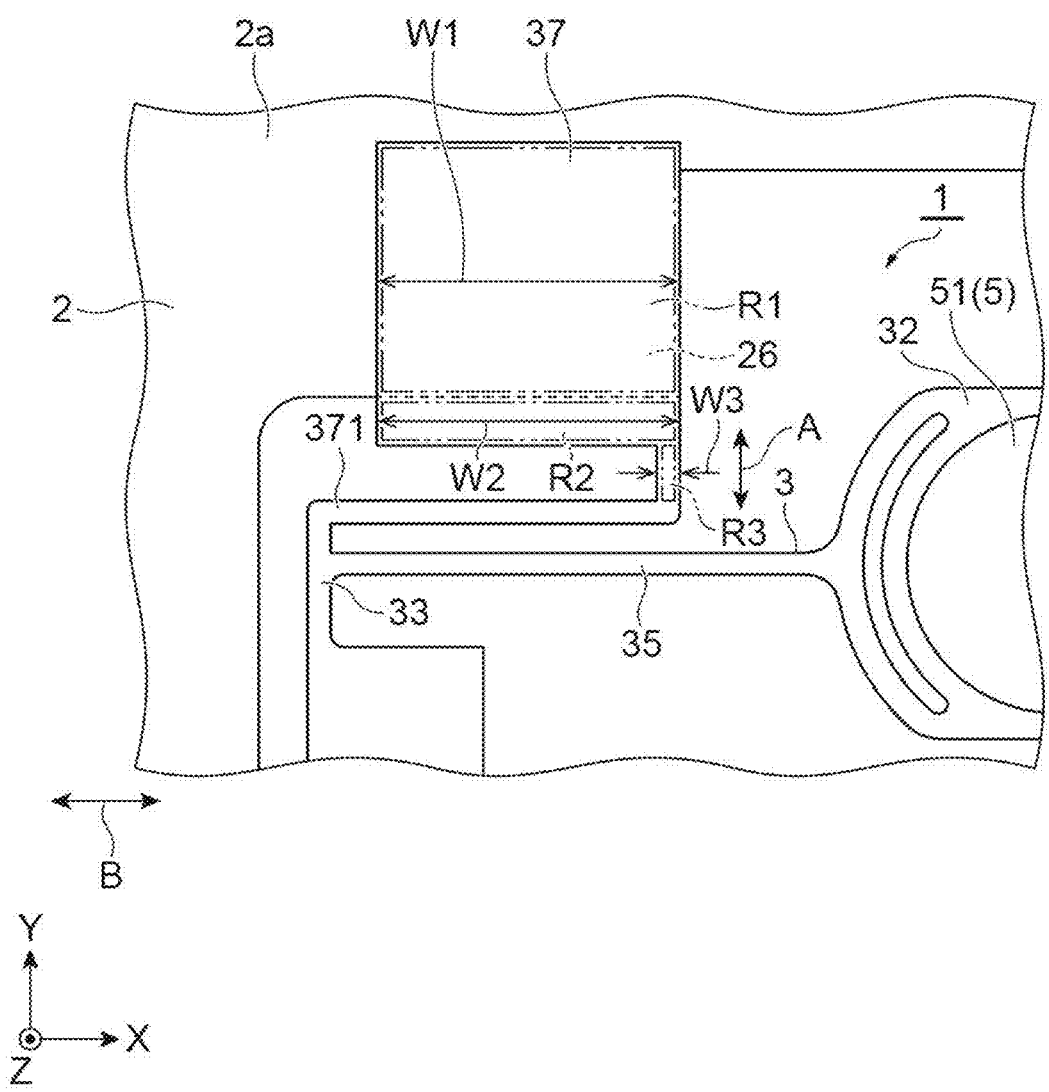
FIG. 8 is a plan view of a portion of a wiring substrate and a metal substrate of a second modification example.
Figure 9:
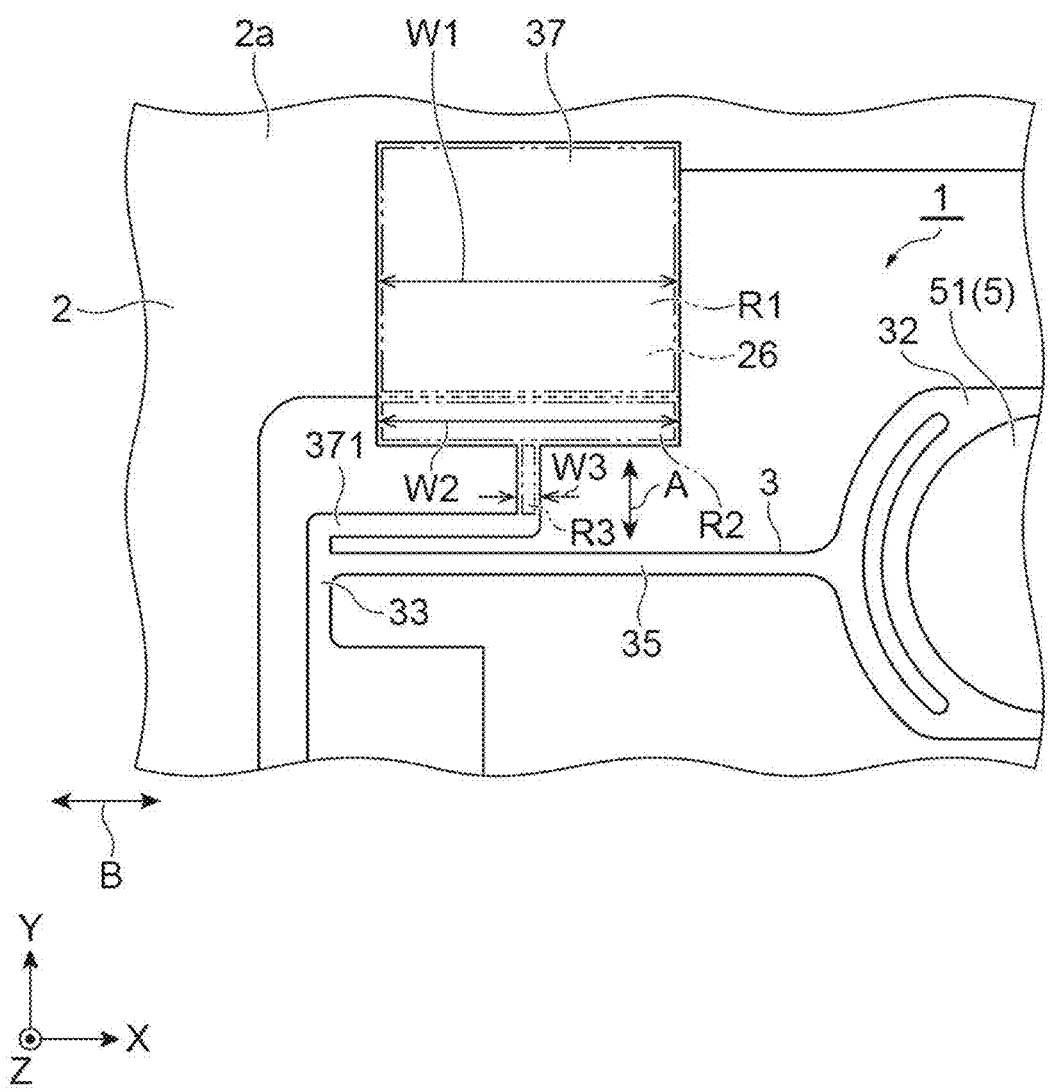
FIG. 9 is a plan view of a portion of a wiring substrate and a metal substrate of a third modification example.
Figure 10:
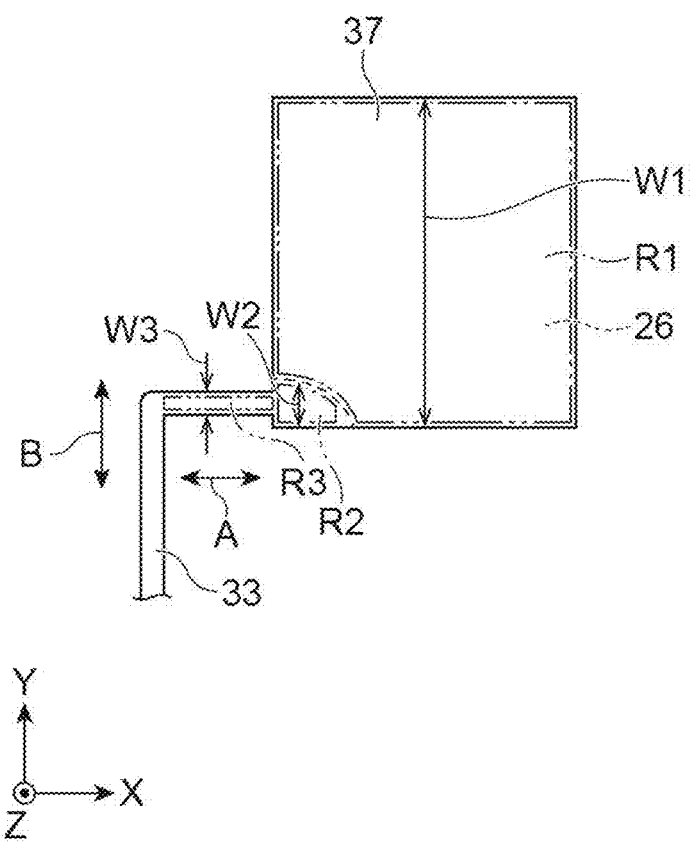
FIG. 10 is a plan view of a portion of a metal substrate of a fourth modification example.

In addition, in the first connection portion 37, the third region R3 may be indirectly connected to the first extending portion 33, and in the second connection portion 38, the third region R3 may be indirectly connected to the second extending portion 34. In addition, in each of the first connection portion 37 and the second connection portion 38, a direction and a position where the third region R3 is connected to the second region R2 may also be different from the direction and the position of the above embodiment. In the examples illustrated in FIGS. 8 and 9, the third region R3 of the first connection portion 37 is indirectly connected to the first extending portion 33. In the examples illustrated in FIGS. 8 and 9, the first connection portion 37 further includes a coupling portion 371 that couples the first extending portion 33 and the third region R3 of the first connection portion 37. The coupling portion 371 extends along, for example, the X-axis direction. In the examples illustrated in FIGS. 8 and 9, the connection direction A is, for example, a direction parallel to the Y-axis direction when viewed in the Z-axis direction. In the example illustrated in FIG. 8, the third region R3 is connected to a portion located farthest to the other side in the X-axis direction and farthest to one side in the Y-axis direction in the second region R2. In the example illustrated in FIG. 9, the third region R3 is connected to a portion located at the center in the X-axis direction and farthest to one side in the Y-axis direction in the second region R2. In each of the examples illustrated in FIGS. 8 and 9, the second region R2 is i) a region that does not face the wiring substrate 2 in the Z-axis direction. In the examples illustrated in FIGS. 8 and 9, a boundary between the second region R2 and the third region R3 is i) a "line along the direction B" when the width of the first connection portion 37 in the direction B changes discontinuously beyond the "line along the direction B" as a boundary. In addition, in the example illustrated in FIG. 10, when viewed in the Z-axis direction, the third region R3 is connected to a portion located farthest to one side in the X-axis direction and farthest to one side in the Y-axis direction in the second region R2, along the connection direction A parallel to the X-axis direction. In the example illustrated in FIG. 10, a boundary between the second region R2 and the third region R3 is ii) a "line along the direction B" when the rate of change in the width of the first connection portion 37 in the direction B changes discontinuously beyond the "line along the direction B" as a boundary. Incidentally, in the example illustrated in FIG. 10, the illustration of the wiring substrate 2 is omitted.

Figure 11:
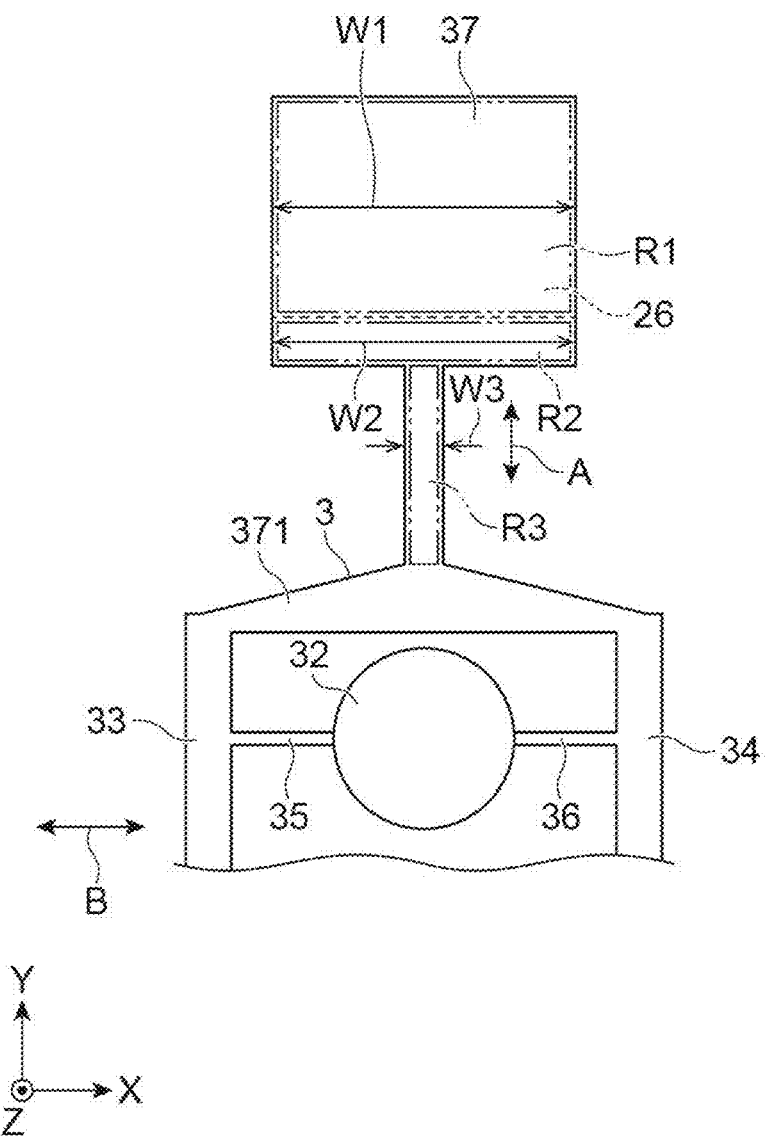
FIG. 11 is a plan view of a portion of a metal substrate of a fifth modification example.

In addition, in the above embodiment, the first connection portion 37 and the second connection portion 38 form a connection portion connected to at least one of the first extending portion 33 and the second extending portion 34, but a configuration of the connection portion is not limited to the configuration of the above embodiment. For example, in the example illustrated in FIG. 11, the first connection portion 37 is connected to both the first extending portion 33 and the second extending portion 34 via the coupling portion 371. Namely, in the example illustrated in FIG. 11, only the first connection portion 37 forms a connection portion, and the metal substrate 3 does not include the second connection portion 38. In the example illustrated in FIG. 11, a boundary between the second region R2 and the third region R3 is i) a "line along the direction B" when the width of the first connection portion 37 in the direction B changes discontinuously beyond the "line along the direction B" as a boundary. Incidentally, in the example illustrated in FIG. 11, the illustration of the wiring substrate 2 is omitted.

Figure 12:
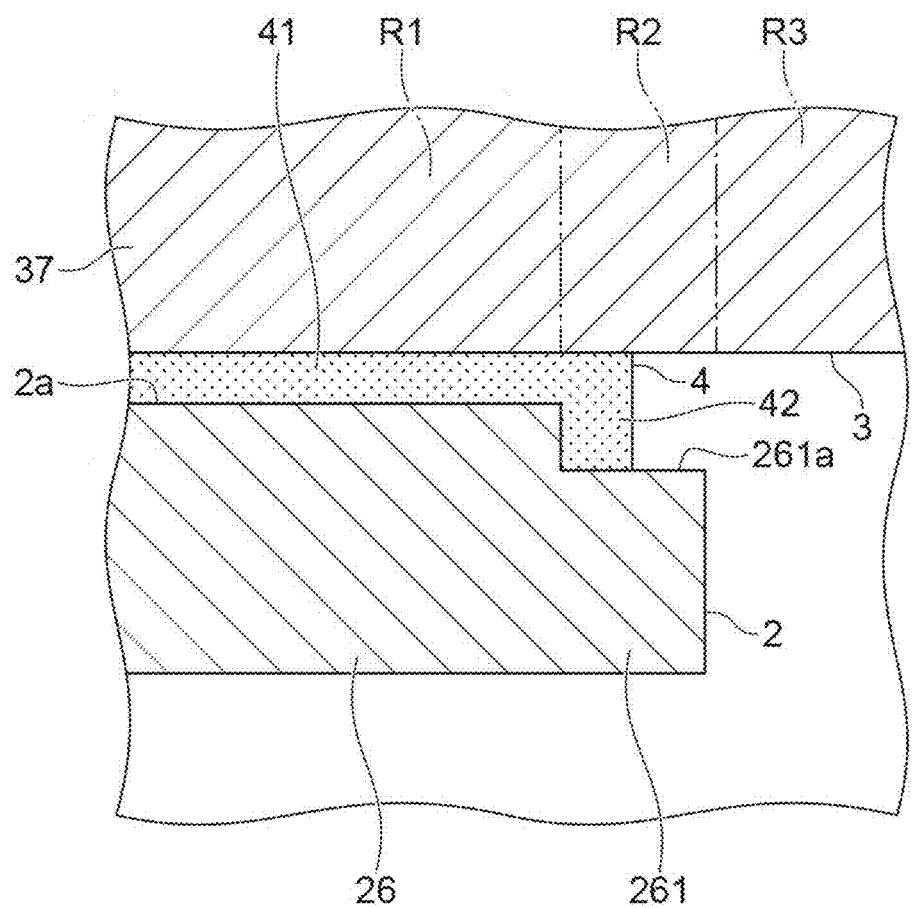
FIG. 12 is a cross-sectional view of a portion of a wiring substrate and a metal substrate of a sixth modification example.

In each of the first connection portion 37 and the second connection portion 38, each of the second region R2 and the third region R3 may face a portion of the wiring substrate 2. When the second region R2 faces a portion of the wiring substrate 2, for example, the second portion 42 of the first bonding member 4 may reach the wiring substrate 2. In the example illustrated in FIG. 12, the second region R2 faces a portion 261 that is a portion of the wiring substrate 2, and the second portion 42 reaches the portion 261. The portion 261 is continuous with the portion 26 in the wiring substrate 2. The portion 261 has a surface 261a on a metal substrate 3 side. The surface 261a is located opposite the metal substrate 3 with respect to the placement surface 2a in the Z-axis direction. The second region R2 faces the portion 261, and the third region R3 does not face the portion 261. As one example, the second portion 42 is in contact with the second region R2, with a side surface of the portion 26, and with the surface 261a of the portion 261. Incidentally, it is preferable that the second portion 42 does not reach an entire portion between the second region R2 and the portion 261. In the example illustrated in FIG. 12, the second region R2 is ii) a region where a distance to the wiring substrate 2 in the Z-axis direction is larger than a distance between the first region R1 and the wiring substrate 2 in the Z-axis direction. Incidentally, the second portion 42 may not reach the third region R3, for example, may reach a third region R3 side from the portion 261 in the X-axis direction and in the Y-axis direction to face the third region R3 via a space.

The wiring substrate 2 is not limited to the shape of the above embodiment, and for example, the wiring substrate 2 may include a recessed portion in which a central portion is recessed opposite the metal substrate 3 with respect to the placement surface 2a, instead of an opening. In that case, each of the second region R2 and the third region R3 may face the recessed portion of the wiring substrate 2. In addition, for example, the wiring substrate 2 may include a plurality of column portions instead of an opening. In that case, each of the second region R2 and the third region R3 may face the wiring substrate 2. In addition, in the above embodiment, the wiring substrate 2 that supports the metal substrate 3 has been provided as an example, but the metal substrate 3 may be supported by, for example, a support body including a plurality of members.

The third connection portion 39 may not include the fourth region R4, the fifth region R5, and the sixth region R6. For example, the third connection portion 39 may include a facing region facing a portion of the wiring substrate 2, and a connection region being continuous with the facing region and connected to the main body portion, instead of the fourth region R4, the fifth region R5, and the sixth region R6.

In the above embodiment, the optical function unit 5 has the optical surface 51 that is a mirror surface, but the optical function unit 5 may be, for example, a reflection type diffraction grating, a transmission type diffraction grating, an optical filter, or the like. In addition, in the above embodiment, the actuator device 1 includes the piezoelectric drive element 6 as a vibration element, but the vibration element may include a vibration source that vibrates in response to a drive signal, and is not limited to a piezoelectric drive type. For example, the vibration element may be an electromagnetic drive type that includes a magnet on the main body portion 31 of the metal substrate 3 and a coil at another location being different from the metal substrate 3 (alternatively, includes a coil on the main body portion 31 of the metal substrate 3 and a magnet at another location being different from the metal substrate 3). The actuator device 1 may include the wiring substrate 2, the metal substrate 3, the first bonding member 4, and the piezoelectric drive element 6. For example, the connector 24, the wire 11, and the wire 12 may not be attached to the actuator device 1. In addition, the actuator device 1 may not include the piezoelectric detection element 7.

An actuator device according to one aspect of the present disclosure includes: a support body; a metal substrate supported by the support body; a bonding member bonding the support body and the metal substrate; and a vibration element disposed on a main body portion included in the metal substrate. The metal substrate further includes a movable portion, a first extending portion and a second extending portion extending from the main body portion such that the movable portion is located between the first extending portion and the second extending portion, a first coupling portion coupling the first extending portion and the movable portion, a second coupling portion coupling the second extending portion and the movable portion, and a connection portion connected to at least one of the first extending portion and the second extending portion. The connection portion includes a first region facing a portion of the support body in a thickness direction of the metal substrate, a second region being continuous from the first region, and a third region being continuous from the second region and connected to at least one of the first extending portion and the second extending portion. When viewed in the thickness direction of the metal substrate, a width of the second region in a direction perpendicular to a connection direction in which the third region is connected to the second region is larger than a width of the third region in the direction perpendicular to the connection direction. The bonding member includes a first portion disposed between the portion of the support body and the first region, and a second portion being continuous from the first portion. The second portion reaches the second region but does not reach the third region.

In the actuator device, the first portion of the bonding member is disposed between the portion of the support body and the first region of the connection portion, and the second portion of the bonding member which is continuous from the first portion reaches the second region of the connection portion which is continuous from the first region. Accordingly, it is possible to cause the bonding member to sufficiently spread between the portion of the support body and the first region of the connection portion, and it is possible to secure bonding strength between the support body and the metal substrate. On the other hand, the second portion of the bonding member reaches the second region of the connection portion which has a width larger than the width of the third region of the connection portion, but the second portion of the bonding member does not reach the third region of the connection portion which has a width smaller than the width of the second region of the connection portion. Accordingly, it is possible to suppress a deterioration in the vibration characteristic of the connection portion, and it is possible to obtain a desired driving characteristic. Therefore, according to the actuator device, it is possible to obtain a desired driving characteristic, and it is possible to secure bonding strength between the support body and the metal substrate.

In the actuator device according to one aspect of the present disclosure, when viewed in the thickness direction of the metal substrate, an area of the first region may be larger than an area of the second region. Accordingly, it is possible to reliably secure bonding strength between the support body and the metal substrate.

In the actuator device according to one aspect of the present disclosure, when viewed in the thickness direction of the metal substrate, an area of the first region may be larger than a sum of an area of the second region and an area of the third region. Accordingly, it is possible to more reliably secure bonding strength between the support body and the metal substrate.

In the actuator device according to one aspect of the present disclosure, when viewed in the thickness direction of the metal substrate, a width of the first region in the direction perpendicular to the connection direction may be larger than the width of the second region in the direction perpendicular to the connection direction. Accordingly, the width of the connection portion gradually increases from the third region toward the first region, so that it is possible to secure both bonding strength between the support body and the metal substrate and a desired driving characteristic.

In the actuator device according to one aspect of the present disclosure, when viewed in the thickness direction of the metal substrate, a region including the first region and the second region may have a polygonal shape, and when viewed in the thickness direction of the metal substrate, the second region may form one corner of the polygonal shape. Accordingly, it is possible to simply provide the second region when compared to, for example, a case where the second region forms a part of a side portion of the region including the first region and the second region.

In the actuator device according to one aspect of the present disclosure, when viewed in the thickness direction of the metal substrate, a boundary line between the first region and the second region may be curved to protrude opposite a vertex of the corner. Accordingly, since the distance from the vertex of the corner of the second region to a boundary between the first region and the second region can be made uniform, it is possible to reliably prevent the bonding member from reaching the third region.

In the actuator device according to one aspect of the present disclosure, the metal substrate may include a first connection portion and a second connection portion, each of the first connection portion and the second connection portion being the connection portion. The first connection portion may be connected to the first extending portion, and the second connection portion may be connected to the second extending portion. Accordingly, it is possible to stably obtain a desired driving characteristic when compared to a case where one connection portion is connected to both the first extending portion and the second extending portion.

In the actuator device according to one aspect of the present disclosure, the second region and the third region may not face the support body in the thickness direction of the metal substrate. Accordingly, it is possible to reliably avoid a risk that the bonding member spreads between the support body and the second region to reach the third region.

In the actuator device according to one aspect of the present disclosure, the metal substrate may further include another connection portion being different from the connection portion. The another connection portion may be connected to the main body portion, and include a fourth region facing another portion of the support body being different from the portion, in the thickness direction of the metal substrate, a fifth region being continuous from the fourth region, and a sixth region being continuous from the fifth region and connected to the main body portion. When viewed in the thickness direction of the metal substrate, a width of the fifth region in a direction perpendicular to another connection direction in which the sixth region is connected to the fifth region and which is different from the connection direction is larger than a width of the sixth region in the direction perpendicular to the another connection direction. The bonding member may further include a third portion disposed between the another portion of the support body and the fourth region, and a fourth portion being continuous from the third portion. The fourth region reaches the fifth region but does not reach the sixth region. Accordingly, also, in the another connection portion being different from the connection portion, since it is possible to cause the bonding member to sufficiently spread between the another portion of the support body and the fourth region of the another connection portion, and it is possible to suppress a deterioration in the vibration characteristic of the another connection portion, it is possible to reliably obtain a desired driving characteristic, and it is possible to reliably secure bonding strength between the support body and the metal substrate.

According to one aspect of the present disclosure, it is possible to provide the actuator device in which a desired driving characteristic can be obtained and bonding strength between the support body and the metal substrate can be secured.

What is claimed is:

1. An actuator device comprising:
   a support body;
   a metal substrate supported by the support body;
   a bonding member bonding the support body and the metal substrate; and
   a vibration element disposed on a main body portion included in the metal substrate,
   wherein the metal substrate further includes a movable portion, a first extending portion and a second extending portion extending from the main body portion such that the movable portion is located between the first extending portion and the second extending portion, a first coupling portion coupling the first extending portion and the movable portion, a second coupling portion coupling the second extending portion and the movable portion, and a connection portion connected to at least one of the first extending portion and the second extending portion,
   the connection portion includes a first region facing a portion of the support body in a thickness direction of the metal substrate, a second region being continuous from the first region, and a third region being continuous from the second region and connected to at least one of the first extending portion and the second extending portion,
   when viewed in the thickness direction of the metal substrate, a width of the second region in a direction perpendicular to a connection direction in which the third region is connected to the second region is larger than a width of the third region in the direction perpendicular to the connection direction,
   the bonding member includes a first portion disposed between the portion of the support body and the first region, and a second portion being continuous from the first portion, and
   the second portion reaches the second region but does not reach the third region.

2. The actuator device according to claim 1, wherein when viewed in the thickness direction of the metal substrate, an area of the first region is larger than an area of the second region.

3. The actuator device according to claim 1, wherein when viewed in the thickness direction of the metal substrate, an area of the first region is larger than a sum of an area of the second region and an area of the third region.

4. The actuator device according to claim 1, wherein when viewed in the thickness direction of the metal substrate, a width of the first region in the direction perpendicular to the connection direction is larger than the width of the second region in the direction perpendicular to the connection direction.

5. The actuator device according to claim 1, wherein when viewed in the thickness direction of the metal substrate, a region including the first region and the second region has a polygonal shape, and
when viewed in the thickness direction of the metal substrate, the second region forms one corner of the polygonal shape.

6. The actuator device according to claim 5, wherein when viewed in the thickness direction of the metal substrate, a boundary line between the first region and the second region is curved to protrude opposite a vertex of the corner.

7. The actuator device according to claim 1, wherein the metal substrate includes a first connection portion and a second connection portion, each of the first connection portion and the second connection portion being the connection portion,
the first connection portion is connected to the first extending portion, and
the second connection portion is connected to the second extending portion.

8. The actuator device according to claim 1, wherein the second region and the third region do not face the support body in the thickness direction of the metal substrate.

9. The actuator device according to claim 1, wherein the metal substrate further includes another connection portion being different from the connection portion,
the another connection portion is connected to the main body portion, and includes a fourth region facing another portion of the support body being different from the portion in the thickness direction of the metal substrate, a fifth region being continuous from the fourth region, and a sixth region being continuous from the fifth region and connected to the main body portion,
when viewed in the thickness direction of the metal substrate, a width of the fifth region in a direction perpendicular to another connection direction in which the sixth region is connected to the fifth region and which is different from the connection direction is larger than a width of the sixth region in the direction perpendicular to the another connection direction,
the bonding member further includes a third portion disposed between the another portion of the support body and the fourth region, and a fourth portion being continuous from the third portion, and
the fourth portion reaches the fifth region but does not reach the sixth region.

* * * * *